United States Patent [19]
Deck

[11] Patent Number: 5,568,003
[45] Date of Patent: Oct. 22, 1996

[54] METHOD AND APPARATUS FOR PRODUCING REPEATABLE MOTION FROM BIASED PIEZOELECTRIC TRANSDUCERS

[75] Inventor: Leslie L. Deck, Middletown, Conn.

[73] Assignee: Zygo Corporation, Middlefield, Conn.

[21] Appl. No.: 313,768

[22] Filed: Sep. 28, 1994

[51] Int. Cl.$^6$ .................................................. H01L 41/08
[52] U.S. Cl. ........................... 310/316; 318/116; 310/317
[58] Field of Search ..................................... 310/316, 317; 318/116

[56] References Cited

U.S. PATENT DOCUMENTS

| | | | |
|---|---|---|---|
| 3,278,770 | 10/1966 | Shoh | 310/316 |
| 4,263,527 | 4/1981 | Comstock | 310/316 |
| 4,689,515 | 8/1987 | Benndorf et al. | 310/316 |
| 4,748,365 | 5/1988 | Poupaert et al. | 310/316 |
| 5,051,646 | 9/1991 | Elings et al. | 310/317 |
| 5,136,199 | 8/1992 | Kawai | 310/317 |
| 5,384,507 | 1/1995 | Takada et al. | 310/317 |

OTHER PUBLICATIONS

"Improving The Linearity Of Piezoelectric Ceramic Actuarators," C. V. Newcomb, *Electronics Letters*, vol. 18, pp. 442–444, 1982.

N. K. Reay, "Sub-nanometre precision closed-loop positioning for optics and X-Y stage control using capacitance displacement sensors and piezo-electric actuators," *SPIE* vol. 2088, pp. 150–159.

Seung-Bae Jung and Seung-Woo Kim, "Improvement of scanning accuracy of PZT piezoelectric actuators by feed-forward model-reference control," *Precision Engineering*, vol. 16 No. 1, pp. 50–55, Jan. 1994.

*Primary Examiner*—Mark O. Budd
*Attorney, Agent, or Firm*—Brian Cave LLP

[57] ABSTRACT

A method and apparatus for producing a repeatable motion profile from a biased piezoelectric transducer (28) in which a first set of stored calibration voltage values corresponding to points in a predetermined voltage profile on the transducer (28) are retrievably accessed from a random access memory (20) by sequentially addressing (30,32,34) the memory (20) in order to drive the piezoelectric transducer (28) with the retrievably accessed calibration voltage values. Gain current values associated with motion of the piezoelectric transducer (28) at the same measurement points on the voltage profile associated with the stored values are measured (48,50,52) and compared against the stored calibration values and any differences are corrected for in order to produce the repeatable motion profile. The measurement points are preferably in a region of constant rate of change of voltage in the voltage profile, such as corresponding to the crossover point (54) in a motion profile of linear slope.

24 Claims, 2 Drawing Sheets

METHOD AND APPARATUS FOR PRODUCING REPEATABLE MOTION FROM BIASED PIEZOELECTRIC TRANSDUCERS

BACKGROUND OF THE INVENTION

1. Field Of The Invention

The present invention relates to methods and apparatus for producing a repeatable motion profile from biased piezoelectric transducers and particularly to such methods and apparatus that are operated in an open loop configuration with a nonzero DC voltage bias.

2. Description Of The Prior Art

Open loop operation of piezoelectric transducers (PZT) is known to be advantageous for reasons of simplicity and cost. However, since piezoelectric transducers are not linear gain devices, the physical motion profile of the PZT is not directly proportional to the voltage profile. In addition, PZTs exhibit hysteresis so that the effect of a voltage change depends on previous voltage history, and they also exhibit creep, a continuous slowly decaying motion after movement in response to a sudden change in voltage. All of these effects are due to the fact that piezoelectric ceramics are produced in a polarized state, which is necessary for the piezoelectric effect in the first place. At a particular bulk polarization, the PZT responds to a voltage change by changing its length proportional to the PZT gain; however, the bulk polarization changes in response to the applied voltage change with a characteristic time proportional to the temperature and field strength. This in turn changes the gain and, hence, the length which produces a feedforward effect which is responsible for the nonlinear way the PZT responds and which is undesirable when repeatable motion is desired from a PZT. These undesirable effects have, at times, been overcome in the prior art by the addition of a distance measuring sensor that has a linear response to displacement and whose signal is fed back to the PZT voltage driver to correct for PZT nonlinearities. However, the additional required physical and electronic apparatus utilized in such a prior art approach, can significantly increase the cost of the PZT system, and, moreover, system bandwidth may be reduced because of propagation delays in the feedback loop and system noise may be increased by the contribution from the displacement sensor.

Another prior art attempt at overcoming these undesirable effects has involved repetitively driving the PZT with the same voltage waveform with a time averaged net voltage of zero volts. Using this prior art approach, open loop PZT motion can be extremely repeatable because the polarization change over any cycle averages to zero and compensating for the PZT nonlinearities by modifying the voltage waveform is a very effective way of producing small, repeatable motions to within fractions of a percent, however there are still problems with this approach, particularly where a non zero net DC voltage is required for the application. An example of this prior art approach is disclosed in U.S. Pat. No. 5,051,696 to Elings which discloses a nonlinear voltage compensation method. Unfortunately there are many important applications in which a non zero net DC voltage is necessary or at least extremely convenient and, thus, this prior art approach provides an undesirable solution. For example, this prior art approach would be unsatisfactory when it was necessary to provide DC voltages to alter the physical location of the scanning region in an atomic force scanning microscope (AFM) or a scanning tunnel microscope (STM) for AFM or STM applications, in which a probe was scanned across the surface of a sample to determine properties of the surface, such as typography or magnetic field strength, so that these properties can be displayed for viewing. Other examples in which a non zero net DC voltage is desired are in unipolar voltage applications or applications that need to use as much of the PZT range as possible—since the typical usable PZT voltage range is very nonsymmetric about zero. However, since operating a PZT with a net DC bias produces a follow-up polarization that changes the net gain over time, this would destroy the motion repeatability in the long term, thus proving unsatisfactory. This property, called drift, is analogous to creep and can be as high as a few percent per time decade. Accordingly, although U.S. Pat. No. 5,051,646 teaches a method for attempting to provide repeatable motion in a PZT, it does not teach or suggest a method for compensating for the resultant drift in biased PZTs. In fact, U.S. Pat. No. 5,051,646 totally ignores the very real problem of drift. Consequently, it would be desirable to find a simple, cost effective way to compensate for drift so as to try to ensure the long term repeatability of the PZT motion over time.

C. V. Newcomb and I. Flinn, in an article entitled "Improving The Linearity of Piezoelectric Ceramic Actuators," Elec. Lett. 18 (1982), pages 442–444, disclosed the fact that, for small strains the PZT extension is linear with respect to applied charge and they proposed a prior art "charge drive," in which the PZT was driven by accounting for the change applied to the drive. In practice, however, it has been found that the small leakage currents which normally exist in any electronics system makes it almost impossible to keep this prior art system at any nonzero DC bias over long periods. Over time the bias simply leaks away. Thus, the prior art charge drive circuit proposed by Newcomb and Flinn would need to periodically switch between "charge" and "voltage" modes of operation to maintain the bias, such as occurs in U.S. Pat. No. 4,263,527 to Comstock, by way of example, thereby adding a significant complexity to the operation. This added complexity is one reason that such prior art charge drive circuits are rarely used.

These disadvantages of the prior art are overcome by the present invention.

SUMMARY OF THE INVENTION

The present invention preferably provides a method and apparatus for producing a repeatable motion profile from piezoelectric motion transducers that are operated in an open loop configuration with a non-zero DC voltage bias using the measured current through the piezoelectric motion transducer to compensate for hysteresis and drift effects which produce gain variations in the transducer. The presently preferred method and apparatus of the present invention preferably comprises providing a sequential driving voltage to approximate the desired motion at one particular piezoelectric motion transducer gain and varying the applied voltage in an iterative manner until the exact desired motion is obtained; measuring the current through the piezoelectric motion transducer at one or more points during the motion once the desired motion is obtained and saving these values; measuring the current through the piezoelectric motion transducer at these points during subsequent motions; using the ratio of the measured to the saved currents as a measure of the piezoelectric motion transducer gain variation; and compensating for this gain variation by either correcting for the gain variation in software or changing the applied voltage waveform to Compensate for the gain variation and repeating the motion. In addition, the leakage current at the bias voltage can also be measured and saved, with the leakage current at the bias voltage during subsequent motions also being measured. The difference between the measured leakage current and the saved leakage current is preferably subtracted from the measured gain currents. Preferably the current is always measured at the same particular point on the voltage profile so that the voltage slope is the same and any changes would only be due to gain variations in the PZT, and most preferably, at a point on the voltage profile where the voltage slope dV/dt is constant and large and in a region where the motion of the PZT is critical to the function of the apparatus. For example, assuming a linear curve, the measurement point would preferably be at the crossover point.

DETAILED DESCRIPTION OF THE PREFERRED EMBODIMENT

Figure 1:
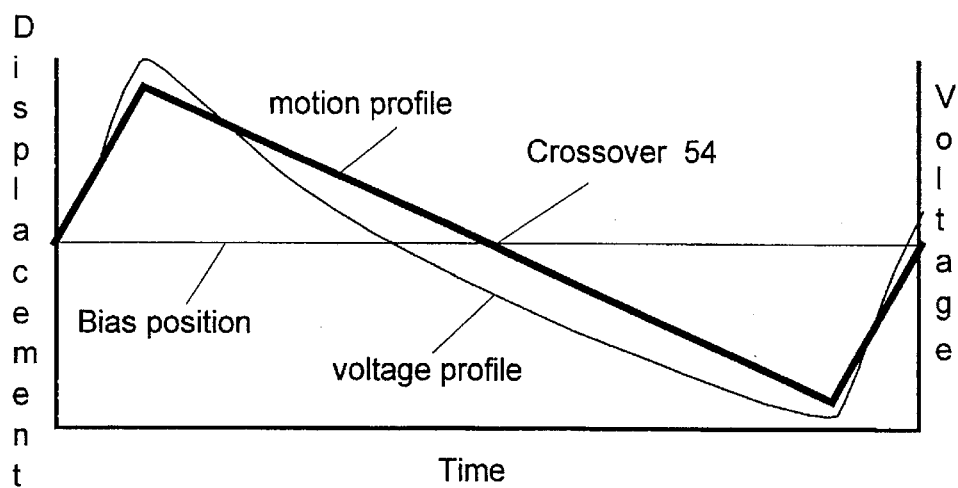
FIG. 1 is a graphical illustration of a typical motion profile and associated voltage profile for a piezoelectric transducer in accordance with the presently preferred method and apparatus of the present invention.
Figure 2:
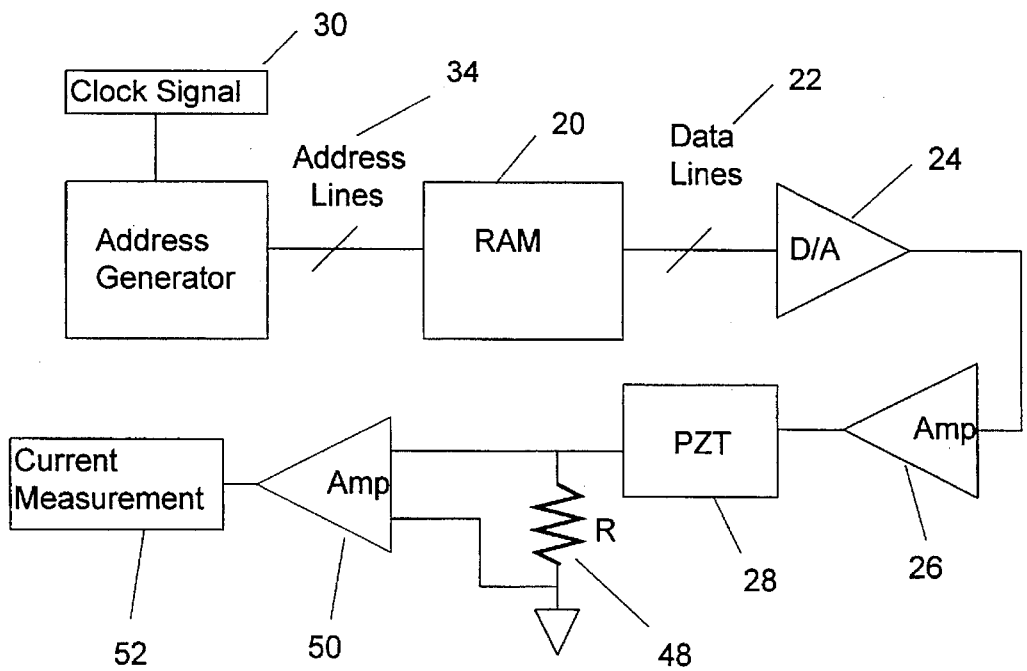
FIG. 2 is a schematic diagram, in block form, of a presently preferrred PZT drive circuit in accordance with the presently preferred method and apparatus of the present invention.
Figure 3:
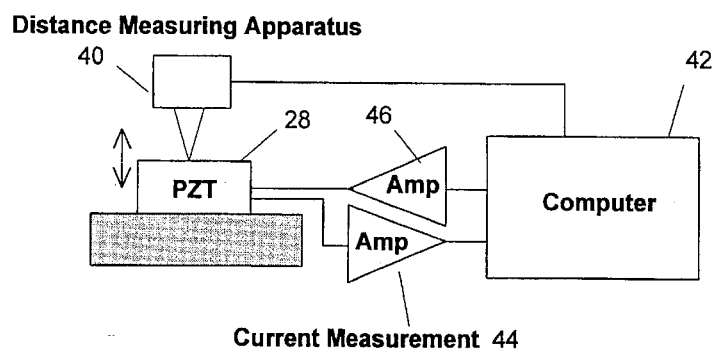
FIG. 3 is a block diagram of a presently preferred arrangement for calibrating the PZT of FIG. 2 by varying the voltage while monitoring the displacement of the PZT.

As will be discussed below, the presently preferred method and apparatus of the present invention, such as illustrated in FIGS. 2 and 3, is capable of providing repeatable motion profiles from piezoelectric transducers without the need for complicated switching electronics or feedback from expensive displacement sensors by employing a PZT system which is cyclically compensated for the effects of any drift normally present in a non-zero net DC voltage bias system. Referring now to the drawings in detail, and initially to FIG. 1, FIG. 1 illustrates a typical motion profile and associated voltage profile of a conventional piezoelectric transducer or PZT 28 to be employed in connection with the presently preferred method and apparatus of the present invention. While a linear motion profile is illustrated in FIG. 1, the presently preferred method and apparatus of the present invention is capable of being used with much more complex motion profiles in which case, measurements are preferably taken at points along the voltage profile where the voltage slope, or voltage rate of change, is constant so as to eliminate errors in the PZT gain calculation. In the instance of the linear curve illustrated in FIG. 1, measurements can preferably be taken anywhere along the linear curve, such as most preferably at the crossover point 54 illustrated in FIG. 1. As used herein, the term "crossover point" is meant to refer to the point at which the PZT 28 sits at the bias voltage. The measurement, however, need not be taken at the crossover point 54 as long as the current is, preferably, always measured at the same particular point on the voltage profile so that the voltage slope is the same, therefore, confining any changes which are detected solely to the gain variations in the PZT 28.

The motion profile, and associated voltage profile, illustrated in FIG. 1 may be produced from the presently preferred system of FIG. 2 by conventionally sequentially reading a conventional digital memory device, such as a random access memory or RAM 20, with the resulting value being output from RAM 20 along data lines 22 being fed to a conventional D/A converter 24 whose output, in turn, preferably drives a conventional amplifier 26 which applies a drive voltage to the conventional piezoelectric transducer 28. As noted above, the sequential reading of the RAM 20 is preferably accomplished in conventional fashion through the use of a clock signal 30, which conventionally causes a conventional address generator 32 to sequentially read out the contents of the addresses in the RAM 20 via address lines 34 to provide these values to the D/A converter 24 along data lines 22. As will be described below, the numerical values stored at these addresses in RAM 20 preferably correspond to the calibration values obtained from using the preferred PZT calibration process, such as one employing the presently preferred calibration system illustrated in FIG. 3. The actual frequency used for the clock signal 30 depends on various factors such as the size of the voltage profile file, the precision of the D/A converter 24, the final accuracy desired, the ramp slope, and the number of points used in the linear region of the ramp. The actual number varies from ramp to ramp and may, by way of example, be from 273 Hz to 1.6 KHz in a typical system in accordance with the present invention. With respect to the address generator 32, it may simply be, by way of example, a digital counter, such as one comprised of HC 161 chips, or such as a programmable logic array.

As shown and preferred in FIG. 3, the PZT 28 is preferably calibrated by varying the voltage while monitoring the PZT 28 displacement. In order to monitor the PZT 28 displacement, preferably a conventional distance measuring interferometer 40, such as a Zygo ZMI Model 1000 interferometer, or a conventional capacitive or inductive sensor, such as capacitive sensor Model D-015.00 or inductive sensor Model E-115.11, both available from Physik Instrumente of Waldbronn, Germany, may be employed as illustrated in FIG. 3. The PZT 28 motion is preferably conventionally measured by the displacement sensor 40 and the applied voltage profile is preferably adjusted after each cycle until the motion profile is as close as desired to the desired profile. This information is obtained from the motion sensor 40 and fed to a conventional computer 42, such as a conventional PC or HP Apollo workstation, by way of example, via a conventional interface, such as an RS232 serial interface or an IEEE-488 parallel interface. The computer 42 also conventionally controls the operation of the distance measuring apparatus 40 and the voltage applied to the PZT 28 via amplifier 46. Preferably, after the desired motion is attained, the current into the PZT 28 at one or more points in the cycle is measured via a conventional current measurement device 44, such as by preferably measuring the voltage across a known resistor 48 in series with the PZT 28. The resulting currents, which pass through conventional amplifier 50, yield current measurements 52 corresponding to the gain currents of the PZT 28. As shown and presently preferred in FIG. 1, the gain current is preferably measured at the crossover point 54 in the PZT motion profile, assuming a linear motion profile in FIG. 1, although the actual position of these measurements is not critical so long as, preferably, these measurements are made in regions of constant rate of change of voltage in the voltage profile so that the current measurement is readily discernible against small errors in measurement location. Preferably, the value of the gain current and the digital representation of the final calibrated voltage profile is saved in the computer 42 memory.

A typical preferred calibration procedure for the PZT 28, using the system of FIG. 3, is as follows, with the scan profile of position versus time being referred to as a "ramp." The computer 42 first generates a file consisting of a column of NRAMP numbers, such as 16384 numbers, that represent the desired motion profile called the Desired Motion Profile (DMP). The numbers represent actual displacement in, for example, microns. The row index for each number represents time. A voltage profile (VP) is then generated from the DMP by dividing each point by an estimate of the PZT 28 gain (unit extension per unit voltage). The gain estimate need not be very good—say within 50%. Gain inaccuracy only impacts the number of iterations required for the process described below to converge. The computer 42 also determines the serial readout rate necessary to obtain the desired slope in the linear region. If the serial rate is changed slightly, to first order only the slope of the linear part of the ramp is changed. The VP numbers are then loaded into RAM which is addressed by a counter whose count is incremented according to a serial clock that runs at the serial rate defined above. As the address sequentially increases, the values accessed by the RAM are delivered to the PZT amplifier 46 through a D/A converter. Now the addresses are a measure of time, equivalent to the row index. One full cycle is processed (all NRAMP values), during which time the DMI 40 measures the physical motion of the PZT 28. After the ramp is finished, the DMI 40 results are subtracted from the DMP on a point by point basis. Any discrepancy is translated into a voltage deviation (again using the approximate PZT gain), which is added to the VP also on a point by point basis. The altered VP is then used as the VP for a new cycle and the process is repeated until the rms deviation between the DMP and the DMI 40 measurements is less than some predetermined amount. That ramp is then considered calibrated and the last VP is saved. Preferably, the DMI file size is normally not identical to NRAMP, however each point is time stamped and therefore can be correlated with the corresponding point in the VP. Some interpolation may be necessary; if so, a linear approximation is usually adequate.

In accordance with the presently preferred method of the present invention, when this calibrated PZT 28 is subsequently employed, the previously saved calibrated digitized voltage profile, such as shown in FIG. 1 in the above example, is loaded into the system of FIG. 2 and saved in RAM 20, with motion then beginning for the PZT 28. The associated PZT 28 gain current associated with this motion is again measured at the same points in the motion profile previously used during calibration of the PZT 28, such as the presently preferred crossover point 54. This measured value is then compared against the previously saved value stored in RAM 20 from the calibration phase. In this regard, it should be noted that the previously referred to prior art article by Newcomb et al. recognizes that the change of polarization is a direct result of the ionic movements within the ceramic, thus the polarization changes with respect to applied charge. What is realized by the preferred method of the present invention is that the PZT 28 gain is also proportional to the polarization. If electrical factors that influence the current can be isolated, the current should be a good monitor of the polarization variations (and hence gain variations) from other causes. Electrically, the applied current satisfies;

$$I_{app} = C \frac{dV}{dt}$$

where C is the PZT 28 capacitance and V is the applied voltage. Assuming that the capacitance is constant and a spot is picked on the voltage profile whose voltage variation is constant, then current variations at that point on the voltage profile should be due to polarization changes alone and the current can be used to monitor the polarization induced changes in the PZT 28 gain. Preferably, the motion profile can then be appropriately modified by either changing the voltage profile on a point by point basis and keeping the readout rate the same or, if the correction is small, by simply changing the readout rate before the next cycle to compensate for the change in PZT 28 gain or, alternatively, the gain change can preferably be simply noted and corrections applied off-line.

In accordance with the present invention, continuous correction may occur for a PZT 28 used in a scanning instrument, such as an AFM or STM, since the time between successive scans is small resulting in adjustments to the voltage motion profile after each scan to compensate for PZT 28 gain variations effectively continuously.

Similarly, by way of example, the presently preferred method of the present invention may preferably be used to provide off-line compensation for PZTs used to provide motion for optical interferometric profilometers. In such an instance, a change in motion profile slope acts like a change in the illumination wavelength and slope errors can preferably be effectively compensated for off-line by an appropriate change of the wavelength used in the software, when the profile is calculated by multiplying the optical phases calculated from the interferometric data by the inverse of the wave number ($2\pi/\lambda$).

Figure 4:
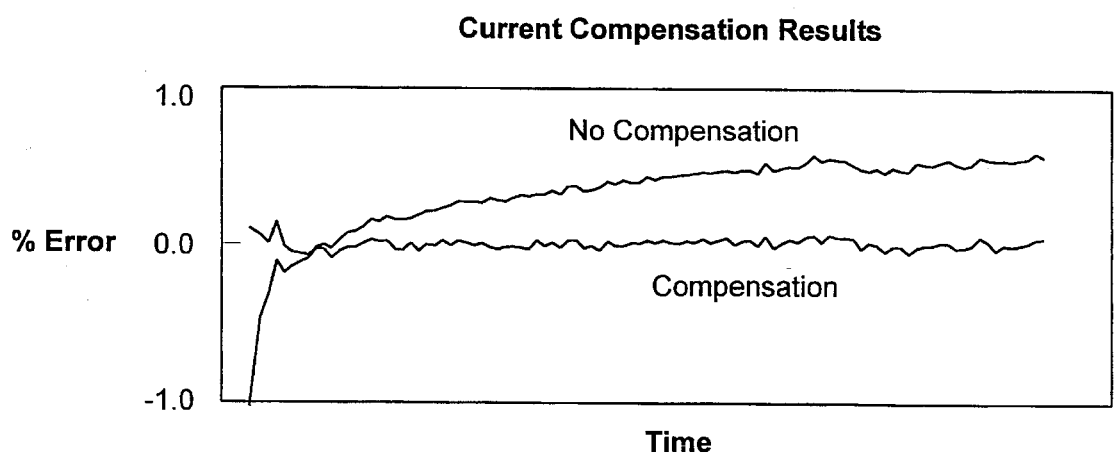
FIG. 4 is a graphical illustration of typical measurements of the slope errors with and without the current compensation system of FIG. 2.

Referring now to FIG. 4, FIG. 4 illustrates a comparison of slope errors with and without the corrections based on the presently preferred method of the present invention using the system of FIGS. 2 and 3, with FIG. 4 showing measurements of the slope of the linear part of the motion profile illustrated in FIG. 1, with and without these corrections. As can be noted from FIG. 4, the improvement in slope repeatability over time as a result of the use of the presently preferred method and apparatus of the present invention has been observed to be marked with slope repeatability typically improving by over a factor of 6.

As previously noted above with respect to the prior art, the effect of leakage current variations on the PZT gain current measurement was a concern in prior art systems and methods since current leakage variation modify the PZT gain current by the amount of leakage change and cannot be ignored. For example, if the system temperature changes over time, errors in the compensation can occur, with well insulated PZTs behaving similarly to a perfect insulator and, thus, having a leakage rate that approximately doubles per 10 degrees centigrade. The size of these errors normally depends on the size of the leakage change relative to the PZT gain current. Moreover, in certain applications which move the PZT slowly so that the PZT gain current is small and temperature variations large, these errors can be significant. By utilizing the presently preferred method and apparatus of the present invention, however, corrections to the gain current measurements during both calibration and use from leakage current contamination can be performed by subtracting out the measured leakage contribution. The gain is then calculated via:

$$G = \frac{I_{gain} - I_{leak}}{I^c_{gain} - I^c_{leak}},$$

where $I_{gain}$ and $I_{leak}$ are the measured gain and leakage currents during use and $I^c_{gain}$ and $I^c_{leak}$ are the measured gain and leakage currents during calibration.

Thus, by utilizing the presently preferred method and apparatus of the present invention, repeatable motion profiles can be achieved from the PZT 28 in a non-zero DC voltage biased open loop system which is cyclically compensated for the effects of drift.

What is claimed is:

1. A method for producing a repeatable motion profile from a biased piezoelectric transducer comprising the steps of:

retrievably accessing a first set of stored calibration voltage values corresponding to points in a desired predetermined voltage profile for said piezoelectric transducer comprising associated gain current values for predetermined points along said voltage profile;

driving said piezoelectric transducer with said retrievably accessed calibration voltage values for producing said repeatable motion profile;

measuring a gain current associated with said motion at measurement points in said motion profile for providing corresponding measured values, said measurement points corresponding to said points associated with said stored calibration values;

comparing said measured gain current values with said stored calibration values for detecting any changes in gain of said piezoelectric transducer from said stored values, and correcting for any differences in said gain from said stored values; whereby said repeatable motion profile may be produced.

2. A method in accordance with claim 1 wherein at least one of said measurement points corresponds to a crossover point in said motion profile.

3. A method in accordance with claim 2 wherein said motion profile comprises a motion profile having a linear slope containing said crossover point.

4. A method in accordance with claim 1 wherein said voltage profile comprises a region of constant rate of change of voltage.

5. A method in accordance with claim 4 wherein said measuring step comprises the step of measuring said gain current at measurement points in said region of constant rate of change of voltage.

6. A method in accordance with claim 1 further comprising the step of compensating for any leakage current variations on said gain current for removing any change in leakage relative to any measured leakage associated with said stored calibration values.

7. A method in accordance with claim 6 wherein said compensating step comprises the step of measuring said leakage when the voltage is fixed at a bias value for said piezoelectric transducer.

8. A method in accordance with claim 7 wherein said correcting step further comprises the step of saving said measured leakage current at said bias voltage and subtracting the difference between said measured leakage current and said saved leakage current from said measured gain current.

9. A method in accordance with claim 1 wherein said accessing step comprises the step of sequentially addressing said stored calibration voltage values out of storage for driving said piezoelectric transducer.

10. A method in accordance with claim 9 wherein said accessing step further comprises the step of sequentially addressing said stored calibration values by clocking said stored calibration values out of said storage.

11. A method in accordance with claim 1 further comprising the step of providing said stored calibration voltage values by varying the voltage while monitoring displacement of said piezoelectric transducer.

12. A method in accordance with claim 11 wherein said displacement monitoring step further comprises the step of monitoring said displacement with a distance measuring interferometer means.

13. A method in accordance with claim 11 wherein said displacement monitoring step further comprises the step of monitoring said displacement with a capacitive sensor.

14. A method in accordance with claim 11 wherein said displacement monitoring step further comprises the step of monitoring said displacement with an inductive sensor.

15. A method in accordance with claim 1 wherein said piezoelectric transducer is used to provide motion for an optical interferometric profilometer, said motion profile having an associated slope, a change in said motion profile slope acting like a change in illumination wavelength for said profilometer, said method further comprising the step of compensating for any slope errors in accordance with said changes in said illumination wavelength.

16. A system for producing a repeatable motion profile from a biased piezoelectric transducer, said transducer having an input and an output, said system comprising memory means for retrievably storing a first set of stored calibration voltage values corresponding to a complete set of points in a desired predetermined voltage profile for said piezoelectric transducer comprising associated gain current values for predetermined points along said complete voltage profile, said memory means having an input and an output; means operatively connected to said memory means input for retrievably accessing said stored calibration voltage values from said memory means for providing a plurality of driving voltages for said piezoelectric driver from said memory means output;

means operatively connected between said memory means output and said piezoelectric transducer input for providing said driving voltages to said piezoelectric transducer input, said transducer exhibiting an associated motion in response to said driving voltages;

means operatively connected to said piezoelectric transducer output for measuring a gain current associated with said motion at a plurality of measurement points in said motion profile for providing corresponding measured values, said measurement points corresponding to points associated with said stored calibration values;

means for comparing said measured gain current values with said stored calibration values for detecting any changes in gain of said piezoelectric transducer from said stored values; and means for correcting for any differences in said gain from said stored values; whereby said repeatable motion may be produced.

17. A system for producing a repeatable motion profile from a biased piezoelectric transducer, said transducer having an input and an output, said system comprising memory means for retrievably storing a first set of stored calibration voltage values corresponding to points in a desired predetermined voltage profile for said piezoelectric transducer comprising associated gain current values for predetermined points along said voltage profile, said memory means having an input and an output; means operatively connected to said memory means input for retrievably accessing said stored calibration voltage values from said memory means for providing a plurality of driving voltages for said piezoelectric driver from said memory means output;

means operatively connected between said memory means output and said piezoelectric transducer input for providing said driving voltages to said piezoelectric transducer input, said transducer exhibiting an associated motion in response to said driving voltages;

means operatively connected to said piezoelectric transducer output for measuring a gain current associated with said motion at a plurality of measurement points in said motion profile for providing corresponding measured values, said measurement points corresponding to points associated with said stored calibration values, said gain current measurement means comprising means for measuring said gain current at a crossover point in said motion profile;

means for comparing said measured gain current values with said stored calibration values for detecting any changes in gain of said piezoelectric transducer from said stored values; and means for correcting for any differences in said gain from said stored values; whereby said repeatable motion may be produced.

18. A system in accordance with claim 17 wherein said gain current measurement means comprises means for measuring said gain current along a region of constant rate of change of voltage in said velocity profile.

19. A system in accordance with claim 16 wherein said gain current measurement means comprises means for measuring said gain current along a region of constant rate of change of velocity in said voltage profile.

20. A system in accordance with claim 17 wherein said memory accessing means comprises means for sequentially addressing said memory means.

21. A system in accordance with claim 20 wherein said sequential addressing means comprises clock generator means.

22. A system in accordance with claim 21 wherein said memory means comprises a random access memory means.

23. A system in accordance with claim 20 wherein said memory means comprises a random access memory means.

24. A system in accordance with claim 17 wherein said memory means comprises a random access memory means.

\* \* \* \* \*